United States Patent [19]
> Taylor

[11] Patent Number: 4,808,944
[45] Date of Patent: Feb. 28, 1989

[54] HIGH ACCURACY DIFFERENTIAL OUTPUT STAGE

[75] Inventor: Stewart S. Taylor, Beaverton, Oreg.

[73] Assignee: TriQuint Semiconductor, Inc., Beaverton, Oreg.

[21] Appl. No.: 123,841

[22] Filed: Nov. 23, 1987

[51] Int. Cl.$^4$ ............................................... H03F 3/45
[52] U.S. Cl. ..................................... 330/253; 330/261
[58] Field of Search ............... 330/252, 253, 259, 260, 330/261

[56] References Cited

U.S. PATENT DOCUMENTS 4,578,647 3/1986 Sasamura ........................... 330/253

Primary Examiner—Gene Wan
Attorney, Agent, or Firm—William S. Lovell; Daniel J. Bedell

[57] ABSTRACT

An output stage for producing a high accuracy differential output signal includes a first differential amplifier providing a pair of single-ended first signals of magnitudes that swing in opposite directions between first and second levels following a change in level of an input signal. A sum of magnitudes of the first signals is controlled by an input control current. The first signals provide input to a second differential amplifier supplying a pair of single-ended second signals swinging in opposite directions between third and fourth levels when the first signals change levels, the second signals forming the differential output signal of the output stage. An indicating signal, provided by the second differential amplifier, supplies a measure of a sum of magnitudes of the second signals. A third differential amplifier produces the control current of magnitude determined by a magnitude difference between the indicating signal and a constant reference signal. Feedback provided by the control signal ensures that the sum of magnitudes of the second signals remains constant so as to ensure that they cross a midpoint level between the third and fourth levels concurrently. The magnitude of the reference signal controls the magnitudes of the third and fourth levels in relation to the midpoint level.

9 Claims, 2 Drawing Sheets

HIGH ACCURACY DIFFERENTIAL OUTPUT STAGE

BACKGROUND OF THE INVENTION

The present invention relates in general to output stages for logic and pulse circuits and in particular to an output stage providing a differential output signal that switches between predetermined high and low levels in an accurately controlled fashion.

Logic and pulse circuits often produce output signals for controlling other circuits but which are unsuitable for applying directly as inputs to the other circuits. For example, output signals produced by a control circuit may swing between levels that differ from the levels recognized by a circuit to be controlled, or the output signals may not convey sufficient power to drive the controlled circuit. In such case, an output stage is typically provided to convert an output signal produced by the control circuit to an output signal that is more appropriate for use as a circuit input.

A differential output stage produces a differential output voltage signal which may be thought of as a potential between two "single-ended" output voltage signals that are referenced to ground or other point of common reference potential. For example, a differential voltage signal suitable for application as input to emitter-coupled logic (ECL) circuits swings between a "high" level of +1 volt and a "low" level −1 volt to indicate a state change. Such an ECL differential voltage signal is suitably a potential between two single-ended voltage signals that swing in opposite directions between a high level of −0.8 volts and a low level of −1.8 volts, referenced to ground. Typically, an ECL logic circuit will recognize a differential input signal as representing a change in logic state when one of the single-ended voltage signals that form a differential input signal rises above −1.3 volts (the midpoint of its swing) and the other single-ended signal falls below −1.3 volts. Consequently, when the two single-ended voltage signals cross the −1.3 volt midpoint level at different times, the logic state represented by the differential input signal is indeterminate for the period of time between the two midpoint crossings. In some applications, the behavior of a circuit receiving the differential signal as input can be unpredictable during such period and can lead to undesirable results. Also, many prior art circuits utilizing field effect transistors do not have well-controlled high and low output levels.

SUMMARY OF THE INVENTION

In accordance with an aspect of the invention, a differential output stage for producing a high accuracy differential output signal includes a first differential amplifier that produces a pair of "single-ended" first signals of magnitudes that swing in opposite directions between first and second levels in response to a change in level of an input signal. The sum of magnitudes of the first signals is controlled in accordance with the magnitude of an input control current. The first signals provide input to a second differential amplifier supplying a pair of "single-ended" second signals that swing in opposite directions between third and fourth levels when the first signals swing between the first and second levels. The magnitude of each of the second signals changes in opposite direction to the magnitude of a corresponding one of the first signals. The second signals form the output differential signal of the output stage. The second differential amplifier also generates an indicating signal providing a measure of a sum of the magnitudes of the second signals. A third differential amplifier produces the control current supplied to the first differential amplifier, the control current being of magnitude determined by a potential difference between the indicating signal and a constant reference signal.

Feedback provided by the control signal in response to the indicating signal ensures that the sum of magnitudes of the second signals remains substantially constant as they swing between the third and fourth levels, thereby ensuring they cross a midpoint between the third and fourth levels at substantially the same time. The magnitude of the reference signal accurately controls the magnitudes of the third and fourth levels in relation to the midpoint level.

It is accordingly an object of the invention to provide an improved output stage for producing a differential signal comprising two single-ended signals that swing in opposite directions between two predetermined levels in response to a change in an input signal level, the two single-ended signals crossing a midpoint level at substantially the same time.

It is another object of the invention to provide an output stage having accurately set and stable high and low output levels which are substantially independent of temperature and process variations.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DESCRIPTION OF THE PREFERRED EMBODIMENT

Figure 1:
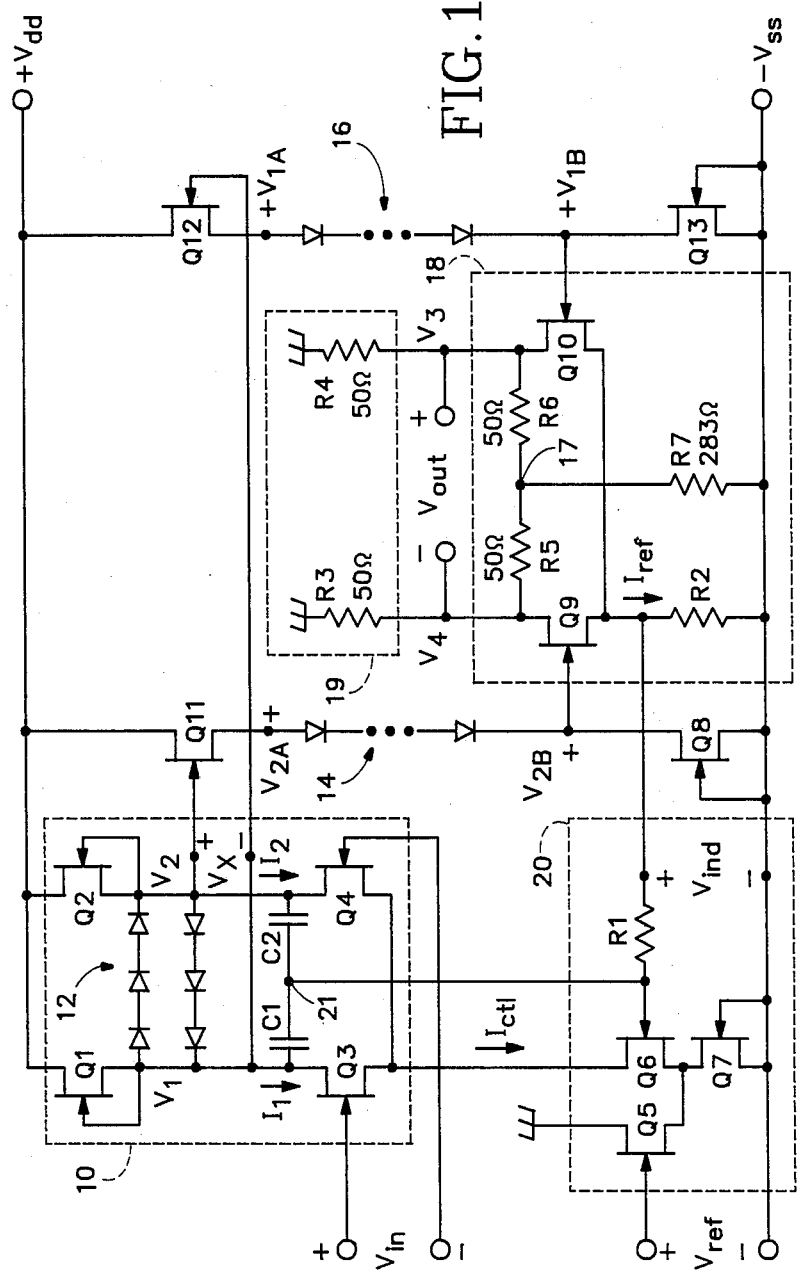
FIG. 1 is a schematic diagram of a differential output stage in accordance with the present invention.

With reference to FIG. 1, depicting in schematic diagram form a differential output stage in accordance with the invention, the output stage comprises a first amplifier 10 for generating a first pair of single-ended output signals $V_1$ and $V_2$ in response to an input signal $V_{in}$. The output signals $V_1$ and $V_2$ form a differential output signal $V_x = V_2 - V_1$. $V_{in}$ is applied between gates of a pair of junction field-effect (JFET) transistors Q3 and Q4 having interconnected sources. The drain of transistor Q3 is tied to the source and gate of another transistor Q1 and the drain of transistor Q4 connects to the source and gate of a transistor Q2. The drains of transistors Q1 and Q2 are returned to a positive voltage source $V_{dd}$. Transistors Q3 and Q4 conduct drain currents $I_1$ and $I_2$, respectively, in response to a control current $I_{ctl}$ supplied to the interconnected sources of transistors Q3 and Q4. Transistors Q1 and Q2 act like current source loads through which currents $I_1$ and $I_2$ pass, thereby developing the single-ended output voltage signals $V_1$ and $V_2$, respectively, at their source terminals. Sets of diodes 12 disposed in series between the sources of transistors Q1 and Q2 form voltage clamps to limit the magnitude of the differential output signal $V_x$ to a range between approximately $+2$ volts and $-2$ volts.

The differential output signal $V_x$ is applied across the bases of another pair of transistors Q11 and Q12 having drains tied to $V_{dd}$. The source of transistor Q11 is connected to the drain of transistor Q8 through a series of diodes 14, the gate and source of transistor Q8 being tied to a voltage source $V_{ss}$, suitably $-5$ V. Similarly, the source of transistor Q12 is connected to the drain of a transistor Q13 through a series of diodes 16, and the gate and source of transistor Q13 are also tied to $V_{ss}$. Transistors Q8 and Q13 act as current sinks drawing currents from the sources of transistors Q11 and Q12 through diodes 14 and 16. Thus, transistors Q11 and Q12 function as source follower amplifiers producing voltage signals V2A and V1A at their sources wherein $V_x = V_{2A} - V_{1A}$. Diodes 14 and 16 level shift $V_{2A}$ and $V_{1A}$ to provide signals $V_{2B}$ and $V_{1B}$ at the drains of transistors Q8 and Q13, respectively. $V_{2B}$ and $V_{1B}$ are lower in voltage than $V_{2A}$ and $V_{1A}$, but the differential voltage signal $V_{2B} - V_{1B}$ is approximately equal to $V_x$.

The differential voltage signal $V_{2B} - V_{1B}$ is applied as input to a second differential amplifier 18 producing in response thereto a pair of single-ended output signals $V_3$ and $V_4$ forming differential output signal $V_{out} = V_3 - V_4$. In the preferred embodiment, $V_{out}$ drives two 50 ohm loads 19, represented for illustrative purposes by a pair of 50 ohm resistors R3 and R4 coupling output terminals of amplifier 18 to ground. Load 19 may be connected to amplifier 18 through a 50 ohm transmission line matched to the load 19 so as to limit signal reflections and attenuation. Amplifier 18 comprises a pair of JFET transistors Q9 and Q10. Voltage signal $V_{2B}$ is applied to the gate of transistor Q9 and voltage signal $V_{1B}$ is applied to the gate of transistor Q10. The sources of transistors Q9 and Q10 are connected together and coupled through a resistor R2 to $V_{ss}$. The drains of transistors Q9 and Q10 provide the single-ended output voltage signals $V_4$ and $V_3$. Fifty ohm resistors R5 and R6 are connected in series between the drains of transistors Q9 and Q10, and another resistor R7 couples a node 17 between R5 and R6 to voltage source $V_{ss}$. Resistors R5 and R6 provide 50 ohm back termination impedance to match the 50 ohm impedance of the transmission line connecting the output amplifier 18 to the load 19. A reference current $I_{ref}$ through resistor R2 comprises a sum of load currents carried by transistors Q9 and Q10 controlled by $V_{2B}$ and $V_{1B}$, respectively. The load current carried by transistor Q9 develops a voltage across R3 to supply output voltage signal $V_4$ at the drain of transistor Q9, while the load current carried by transistor Q10 develops a voltage across R4 to provide output voltage signal $V_3$ at the drain of transistor Q10.

In the preferred embodiment of the invention, the output stage produces a differential output voltage signal $V_{out} = V_3 - V_4$ suitable for driving an emitter-coupled logic (ECL) circuit. In such case it is desirable that $V_{out}$ have high and low levels of $+1$ volt and $-1$ volt, respectively, and that the single-ended output signals $V_3$ and $V_4$ that form $V_{out}$ swing in opposite directions between $-0.8$ and $-1.8$ volts about a midpoint level $-1.3$ volts. It is also desirable that as $V_3$ and $V_4$ swing in opposite directions between $-0.8$ and $-1.8$ volts they cross the midpoint level $-1.3$ volts at the same time. As described hereinbelow, this is accomplished by employing feedback to ensure the sum $V_3 + V_4 = -2.6$ volts at all times. Thus, whenever $V_3$ is equal to $-1.3$ volts, $V_4$ is also equal to $-1.3$ volts.

When the differential input voltage $V_{2B} - V_{1B}$ to amplifier 18 swings between its maximum positive value and its maximum negative value, the single ended output voltage signals $V_3$ and $V_4$ swing in opposite directions between $-0.8$ and $-1.8$ volts. Resistor R7 in the described embodiment is selected to be 283 ohms so that node 17 is maintained at the midpoint level of $-1.3$ volts. The range of voltage swing of $V_3$ and $V_4$ above or below the midpoint $-1.3$ volt level is controlled by the reference current $I_{ref}$ through resistor R2. When $I_{ref}$ is large, the voltage rise or fall of $V_3$ or $V_4$ above or below $-1.3$ volts is large and when $I_{ref}$ is small, the voltage rise or fall of $V_3$ and $V_4$ above or below volts is small. Since the sum $V_3 + V_4$ is $-1.3$ volts is large and when $I_{ref}$ is small, the proportional to the magnitude of reference current $I_{ref}$ through resistor R2, $I_{ref}$ is held constant in order to hold the sum $V_3 + V_4$ constant at $-2.6$ volts. But the magnitude of $I_{ref}$ is proportional to the sum $V_{1B} + V_{2B}$, which sum rises and falls with the sum $V_1 + V_2$. Therefore, it is necessary to hold the sum $V_1 + V_2$ constant as $V_1$ and $V_2$ swing between their maximum and minimum levels.

Figure 2:
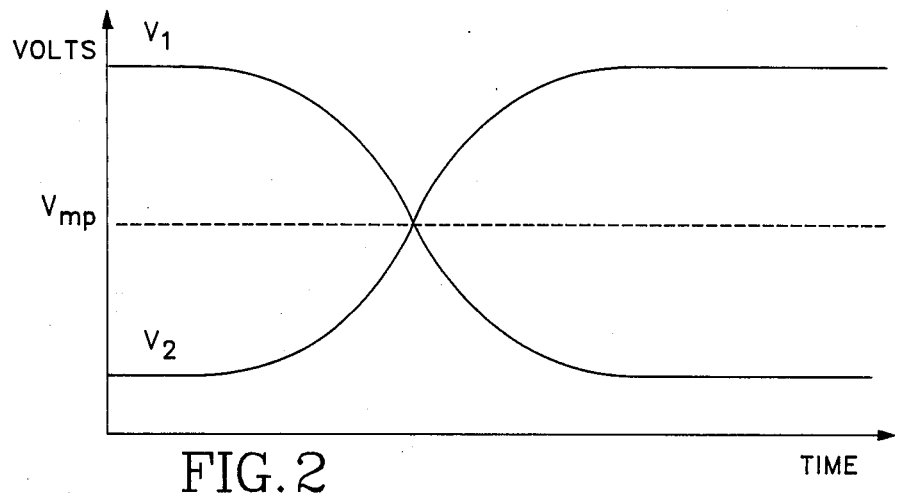
FIGS. 2–4 are timing diagrams showing behavior of signals produced by the differential output stage of FIG. 1.
Figure 3:
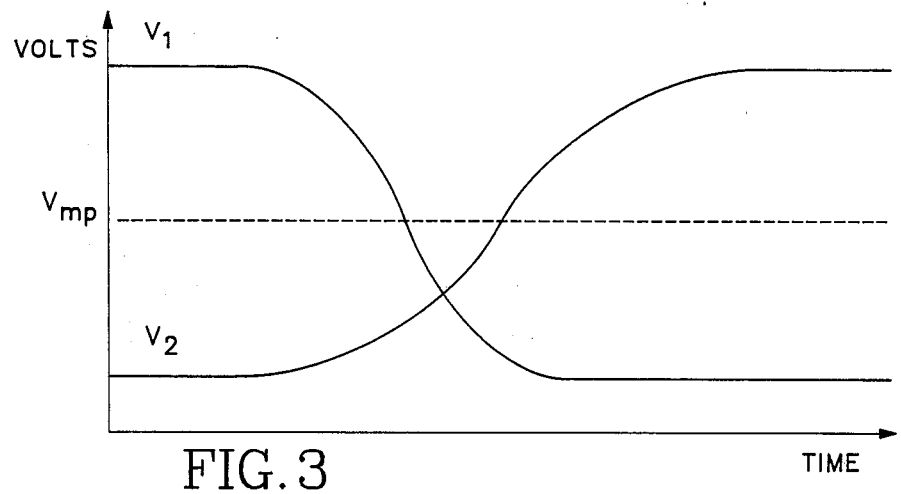
Figure 4:
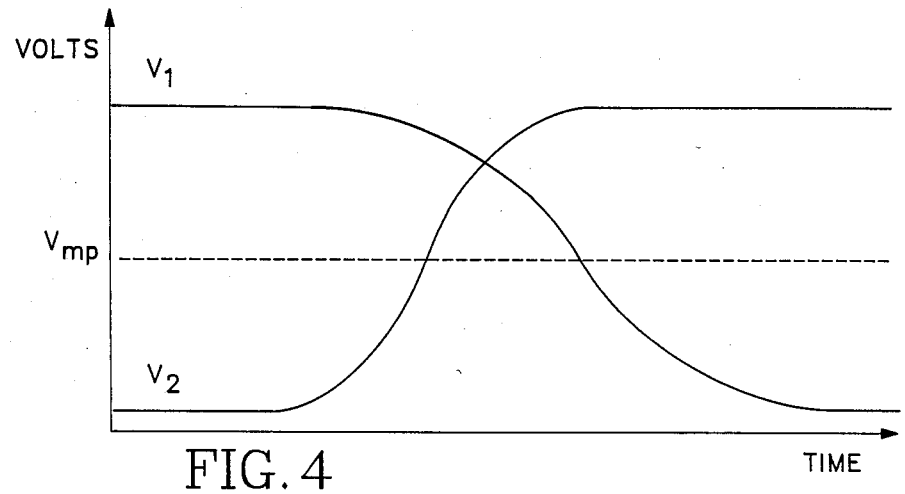

FIG. 2 shows the desired time behavior of voltage signals $V_1$ and $V_2$ as $V_1$ swings from maximum to minimum levels and $V_2$ swings from minimum to maximum levels following a change in level of $V_{in}$. In FIG. 2, the sum $V_1 + V_2$ is constant which implies that the rate of change of $V_1$ is equal to the negative of the rate of change of $V_2$ (i.e., $dV_1/dt = -V_2/dt$), and which implies that $V_1$ and $V_2$ reach the midpoint level between their swings at the same time. Since $V_1$ and $V_2$ reach their midpoint levels at the same time, output voltage signals $V_4$ and $V_3$, following $V_1$ and $V_2$, also reach their midpoint levels at the same time. This behavior can be achieved when current $I_{ctl}$ is controlled to an appropriate value in a manner described hereinbelow. FIGS. 3 and 4 illustrate the time behavior of $V_1$ and $V_2$ when $I_{ctl}$ is too high or too low. In FIG. 3, $I_{ctl}$ is too high and $V_1$ initially falls more rapidly than $V_2$ rises. In FIG. 4, $I_{ctl}$ is too low and $V_2$ rises more rapidly than $V_1$ falls. In either case, as may be discerned from FIGS. 3 and 4, the sum $V_1 + V_2$ does not remain constant as $V_1$ and $V_2$ change, and the magnitudes of $V_1$ and $V_2$ do not cross the midpoint level $V_{mp}$ at the same time.

To ensure that the sum $V_1 + V_2$ (and therefore the sum $V_3 + V_4$) remains constant, the control current $I_{ctl}$ is appropriately adjusted by feedback. With reference to FIG. 1, an externally generated reference voltage $V_{ref}$ and an indicating voltage $V_{ind}$, developed across resistor R2 in response to the reference current $I_{ref}$ passing through resistor R2, are applied as inputs to another differential amplifier 20 which produces the control current $I_{ctl}$ supplied as control input to amplifier 10. The magnitude of $I_{ctl}$ is determined by a difference between $V_{ref}$ and $V_{ind}$. Amplifier 20 suitably comprises a pair of transistors Q5 and Q6 having sources tied to the drain of another transistor Q7, the gate and source of transistor Q7 being connected to $V_{ss}$. The drain of transistor Q5 is grounded and the drain of transistor Q6, coupled to the sources of transistors Q3 and Q4, supplies the control current $I_{ctl}$ to amplifier 10. The reference voltage $V_{ref}$ is applied between $V_{ss}$ and the gate of transistor Q5. The gate of transistor Q6 is connected through a resistor R1 to the sources of transistors Q9 and Q10 of amplifier 18 and also to a junction 21 between two capacitors C1 and C2 within amplifier 10. Capacitor C1 couples the drain of transistor Q3 to node 21 and capacitor C2 couples the drain of transistor Q4 to node 21. Transistor Q7 acts as a current sink drawing a constant current from transistors Q5 and Q6, the relative proportion of the current supplied to transistor Q7 by transistor Q6 (i.e., the control current of $I_{ctl}$) being determined by the magnitude of indicating voltage $V_{ind}$ in relation to the magnitude of reference voltage $V_{ref}$. Capacitors C1 and C2, in conjunction with resistor R1, are provided to ensure stability in the feedback control loop.

When indicating voltage $V_{ind}$ increases above reference voltage $V_{ref}$, control current $I_{ctl}$ increases. As $I_{ctl}$ increases, the sum of output voltages $V_1$ and $V_2$ of amplifier 10 falls, thereby decreasing the sum of $V_{2B}$ and $V_{1B}$. As the sum of $V_{2B}$ and $V_{1B}$ falls, current $I_{ref}$ decreases, pulling down indicating voltage $V_{ind}$. Conversely, when indicating voltage $V_{ind}$ falls below $V_{ref}$, $I_{ctl}$ decreases causing the sum of $V_1$ and $V_2$ to rise. In response to a rise in the sum $V_1 + V_2$, the sum $V_{1B} + V_{2B}$ also rises, thereby driving up current $I_{ref}$ and indicating voltage $V_{ind}$. Thus, the feedback provided by differential amplifier 20 ensures that the indicating voltage $V_{ind}$ remains substantially equal to the reference voltage $V_{ref}$. Since $V_{ref}$ is a constant, indicating voltage $V_{ind}$, current $I_{ref}$ and the sum $V_3 + V_4$ are also substantially constant. By selecting an appropriate combination of reference voltage $V_{ref}$ and R2, the sum $V_3 + V_4$ can be set to a constant $-2.6$ volts, thereby ensuring that output voltage signals $V_3$ and $V_4$ swing in opposite directions between $-0.8$ and $-1.8$ volts after a change in level of $V_{in}$, and ensuring they cross the $-1.3$ volt midpoint level at the same time. This is the desired behavior of a signal suitable for use as input to an ECL circuit. It should be noted the high and low voltage levels of output voltage signals $V_3$ and $V_4$ are substantially independent of characteristics of the transistors Q1 through Q13 which may vary with temperature or fabrication process.

An output stage has been described for producing a differential signal comprising two single-ended signals that swing in opposite directions between two accurately controlled levels in response to a change in an input signal level, the two single-ended signals crossing a midpoint level between the two levels at the same time. While in the preferred embodiment, as illustrated in FIG. 1, the output signals $V_3$ and $V_4$ swing between $-0.8$ and $-1.8$ levels so as to be suitable for use as input to ECL circuits, it should be understood the circuit of FIG. 1 can be easily adapted to provide output signals that swing between other levels. The midpoint level of the voltage swings of $V_3$ and $V_4$ can be adjusted by changing the value of R7 and/or $V_{ss}$, and the range of the swings from the midpoint level can be altered by adjusting $V_{ref}$ and/or resistor R2. While in the preferred embodiment, the circuit has been implemented utilizing depletion mode junction field effect transistors, some of transistors Q1–Q13 could alternatively be implemented utilizing other types of transistors including, for example, MOSFETs, GaAsFETs, enhancement mode JFETs or bipolar transistors when suitably biased. Also transistors Q1 and Q2, could be replaced by resistors, and transistors Q7, Q8 and Q13, acting as current sources, could be replaced by resistors or any of a large number of well-known current source circuits.

Accordingly, while a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A differential output stage responsive to an input signal and a reference signal comprising:

first means for producing first output signals, wherein one of the first output signals changes from a first level to a second level and another of the first output signals changes from a second level to a first level in response to a change in level of the input signal, and wherein a sum of magnitude of the first output signals is controlled by a control signal applied as input thereto;

second means responsive to the first output signals for producing second output signals, wherein one of the second output signals changes from a third level to a fourth level and another of the second output signals changes from a fourth level to a third level when the first output signals change between the first and second levels, and for producing an indicating signal that is a measure of a sum of magnitudes of the second output signals; and third means for generating said control signal of magnitude adjusted in accordance with a magnitude difference between the indicating signal and the reference signal.

2. The output stage in accordance with claim 1 wherein the control signal is a control current and the first means comprises:

first transistor means having a control terminal and having first and second load terminals for conducting a first current between its first and second load terminals;

second transistor means having a control terminal and first and second load terminals for conducting a second current between its first and second load terminals;

the second load terminals of the first and second transistor means being coupled one to another and receiving the control current, a portion of the control current being directed through the first transistor means as the first current and a remaining portion of the control current being directed through the second transistor means as the second current, the input signal being applied across the control terminals of the first and second transistor means and controlling relative magnitudes of the first and second currents;

a source of supply voltage;

first load means for coupling the source of supply voltage to the first load terminal of the first transistor means, one of the first output signals being produced at the first load terminal of the first transistor means; and second load means for coupling the source of supply voltage to the first load terminal of the second transistor means, another of the first output signals being produced at the first load terminal of the second transistor means.

3. The output stage in accordance with claim 1 wherein the second means comprises:

first transistor means having a control terminal and first and second load terminals for conducting a first current between its first and second load terminals;

second transistor means having a control terminal and first and second load terminals for conducting a second current between its first and second load terminals, the second load terminals of the first and second transistors being connected one to another;

means for coupling one of the first output signals to the control terminal of the first transistor means and for coupling the other of the first output signals to the control terminal of the second transistor means, the first and second currents having magnitudes controlled in accordance with magnitudes of the first output signals;

a source of supply voltage; and impedance means coupling the second load terminals of the first and second transistor means to the source of supply voltage, the indicating signal being developed in accordance with a potential at the second load terminals of the first and second transistor means, one of the second output signals being produced at the first load terminal of the second transistor means and the other of the second output signals being produced at the first load terminal of the second transistor means.

4. The output stage in accordance with claim 3 wherein the second means further comprises:
   a circuit node,
   a first resistor connected between the first load terminal of the first transistor means and the circuit node,
   a second resistor connected between the first load terminal of the second transistor means and the circuit node, and
   means for maintaining a constant potential at the circuit node.

5. The output stage in accordance with claim 1 wherein the third means comprises a differential amplifier having the reference signal and the indicating signal as inputs and producing the control signal as output.

6. A differential output stage responsive to an input signal and a reference signal comprising:
   first transistor means having a control terminal and first and second load terminals for conducting a first current between its first and second load terminals;
   second transistor means having a control terminal and first and second load terminals for conducting a second current between its first and second load terminals;
   the second load terminals of said first and second transistor means being coupled one to another and receiving a control current, a portion of the control current being directed through the first transistor means as the first current and a remaining portion of the control current being directed through the second transistor means as the second current, the input signal being applied across the control terminals of the first and second transistor means and controlling magnitudes of the first and second currents;
   a first source of supply voltage;
   first load means for coupling the first source of supply voltage to the first load terminal of the first transistor means, one of a pair of first output signals being produced at the first load terminal of the first transistor means;
   second load means for coupling the first source of supply voltage to the first load terminal of the second transistor means, another of the pair of first output signals being produced at the first load terminal of the second transistor means;
   third transistor means having a control terminal and first and second load terminals for conducting a third current between its first and second load terminals;
   fourth transistor means having a control terminal and first and second load terminals for conducting a fourth current between its first and second load terminals;
   means for coupling one of the first output signals to the control terminal of the third transistor means and for coupling the other of the first output signals to the control terminal of the fourth transistor means, the third and fourth currents having magnitudes controlled in accordance with magnitudes of the first output signals;
   a second source of reference potential;
   impedance means coupling the second load terminals of the third and fourth transistor means to the second source of supply voltage, an indicating signal being developed in accordance with potentials at the second load terminals of the third and fourth transistor means, one of a pair of second output signals being produced at the first load terminal of the third transistor means and the other of the pair of second output signals being produced at the first load terminal of the fourth transistor means; and
   feedback control means responsive to the reference signal and the indicating signal for generating the control current applied as input to the first means, wherein the control current is generated in accordance with a magnitude difference between the indicating signal and the reference signal.

7. The output stage in accordance with claim 6 further comprising:
   a circuit node,
   a first resistor connected between the first load terminal of the third transistor means and the circuit node,
   a second resistor connected between the first load terminal of the fourth transistor means and the circuit node, and
   means for maintaining a constant potential at the circuit node.

8. The output stage in accordance with claim 6 wherein the feedback control means comprises a differential amplifier having the reference signal and the indicating signal as inputs and producing the control current as output.

9. A method for producing a differential output signal that changes level in response to a change in level of an input signal, comprising the steps of:
   producing single-ended first output signals, wherein one of the first output signals changes from a first level to a second level and another of the first output signals changes from the second level to the first level in response to the change in level of the input signal, and wherein a sum of magnitudes of the first output signals is controlled by a control signal;
   producing single-ended second output signals comprising the differential output signal, wherein one of the second output signals changes from a third level to a fourth level and another of the second output signals changes from the fourth level to the third level when the first output signals change between the first and second levels;

providing an indicating signal that is a measure of a sum of magnitudes of the second output signals providing a reference signal; and generating the control signal in accordance with a magnitude difference between the indicating signal and the reference signal.

* * * * *